United States Patent [19]

Oberst

[11] 3,723,889

[45] Mar. 27, 1973

[54] PHASE AND FREQUENCY COMPARATOR

[75] Inventor: James Francis Oberst, Howell Twp., Monmouth County, N.J.

[73] Assignee: Bell Telephone Laboratories, Incorporated, Murray Hill, N.J.

[22] Filed: Dec. 22, 1971

[21] Appl. No.: 210,644

[52] U.S. Cl. ......................328/134, 328/94, 328/99, 307/233, 307/218, 307/217, 307/225, 328/110

[51] Int. Cl. ..........................................H03d 13/00

[58] Field of Search......307/233, 232, 228, 225, 218, 307/217; 328/133, 134, 94, 99, 110

[56] References Cited

UNITED STATES PATENTS

| | | | |
|---|---|---|---|
| 3,124,755 | 3/1964 | Williamson et al. | 328/134 |
| 3,521,174 | 7/1970 | Naubereit et al. | 328/110 X |
| 3,610,954 | 10/1971 | Treadway | 307/232 |
| 3,688,202 | 8/1972 | Naubereit | 328/133 |

*Primary Examiner*—John S. Heyman
*Attorney*—R. J. Guenther et al.

[57] ABSTRACT

A sawtooth phase comparator is arranged to act as a frequency comparator when the frequencies of the input and reference signals differ by a substantial amount. This is accomplished by using a phase comparator consisting of a flip-flop with first and second frequency counters connected between the input signal and its SET input, and between the reference signal and its RESET input, respectively. Means are provided for inhibiting the input signal whenever it would cause a signal to appear at the set input of the flip-flop when it is already set and for inhibiting the reference signal whenever it would cause a signal to appear at the RESET input when it is already reset. This eliminates the alternating polarity signal which prior art comparators produce when the linear portion of the transfer characteristic is exceeded. Consequently, a frequency correcting signal is produced.

5 Claims, 3 Drawing Figures

Patented March 27, 1973 3,723,889

PHASE AND FREQUENCY COMPARATOR

BACKGROUND OF THE INVENTION

This invention relates to phase-locked loops and, more particularly, to combination phase and frequency comparators (PFC), which are useful in phase-locked loops.

In a basic phase-locked loop an input signal and a reference signal from a local voltage-controlled oscillator (VCO) are compared in a phase detector. The output of the phase detector, representing the difference in phase between the two signals, is then used to vary the output of the VCO in such a way that it is made equal in phase to the input signal. One of the most basic types of phase comparators consists of an R-S (Reset-Set) flip-flop with the input signal applied to its SET input and the reference signal applied to the RESET input. With this arrangement the width of the output pulse of the flip-flop will indicate the phase difference between the two signals. The pulsed output is then integrated in a low-pass filter to generate a dc signal which is used to control the output of the VCO.

The transfer function of this phase comparator resembles a sawtooth pattern which repeats every 360°. This can be seen from the fact that the comparator output is nearly zero when the two signals have about the same phase relationship. As the phase difference increases, the pulse width increases, causing a corresponding increase in the output of the filter. This generates the ramp portion of the sawtooth characteristic. However, if the input signal had been leading the reference signal and the phase error increases to the point where a reference pulse occurs before the input pulse, the circuit will change states and the pulse width will become small again. This occurs because the reference pulse has slipped a cycle and is now almost in phase coincidence with the succeeding input pulse. This change of states causes the output of the filter to drop abruptly to zero, thus completing the sawtooth characteristic. In this type of circuit a dc bias voltage is usually applied to the filter so that the characteristic will be symmetrical about zero.

When the frequencies of the input and test signals differ by a significant amount, the circuit will continually slip cycles and will produce a signal which alternates between positive and negative values. When this alternating signal is applied to the VCO of the phase-locked loop, the loop will not be able to acquire a lock since it will not know whether the positive or the negative signal is the correct one. This problem is partially solved by putting digital counters or frequency dividers between the input signal and the SET input, and between the reference signal and the RESET input of the flip-flop, respectively. This extends the ramp portion of the sawtooth characteristic from $\pm 180$ degrees to $\pm(N \times 180)$ degrees, where $N$ is the division achieved by the divider circuit. Therefore, the acquisition range has been increased by a factor of $N$. However, if this expanded range is exceeded, the alternating signal will still occur. This will usually happen when the frequencies of the input and reference signals differ by a substantial amount. In order to correct this situation, a frequency detector must be used to produce a signal which will control the VCO in such a way that the two frequencies will be matched. Then the phase detector will take over and cause the VCO output to match the phase of the input signal.

It is therefore an object of this invention to provide a circuit which will modify the operation of the the simple flip-flop phase detector so that it will function as a combination phase and frequency detector.

SUMMARY OF THE INVENTION

The present invention is directed to expanding the acquisition range of a simple one flip-flop phase detector with counters by modifying its operation to include frequency detection. This is accomplished by inhibiting the SET or RESET inputs when the flip-flop is already set or reset, respectively. This invention is particularly useful since with the addition of a relatively small number of parts it allows for an improvement in the many systems which utilize the one flip-flop phase detector with counters.

In an illustrative embodiment of the invention, counter circuits allow one of every N pulses of the input and reference signals to be applied to the SET and RESET inputs of a flip-flop, respectively. The state of the flip-flop and the counters is then monitored in first and second AND gates. When it appears that the counter is in a condition which will allow an input pulse to reach the SET input when the flip-flop is already set, the first AND gate will cause the input pulse to be blocked, thus giving the reference pulse an opportunity to reset the flip-flop before the next input pulse occurs. The second AND gate performs the same function for the RESET line. This prevents the average output level from making a dramatic change. Therefore, when the output is passed through a low-pass filter and is biased about zero, it will remain positive when the input frequency is higher than the reference frequency and negative when it is lower. This, in effect, makes the circuit operate as a frequency detector when the frequencies are not matched and a phase detector when they are.

The foregoing and other features of the present invention will be more readily apparent from the following detailed description and drawings.

DETAILED DESCRIPTION

Figure 1:
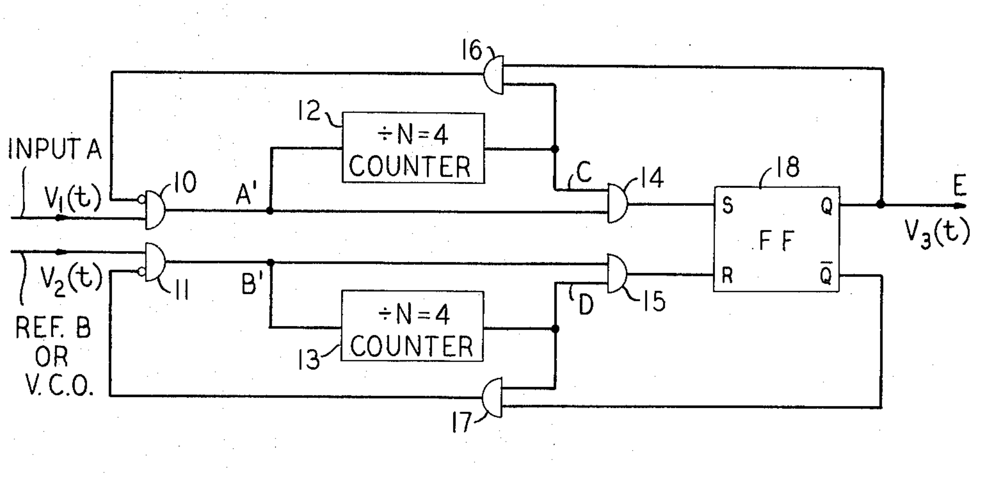
FIG. 1 is a schematic of an illustrative embodiment of the invention.
Figure 2:
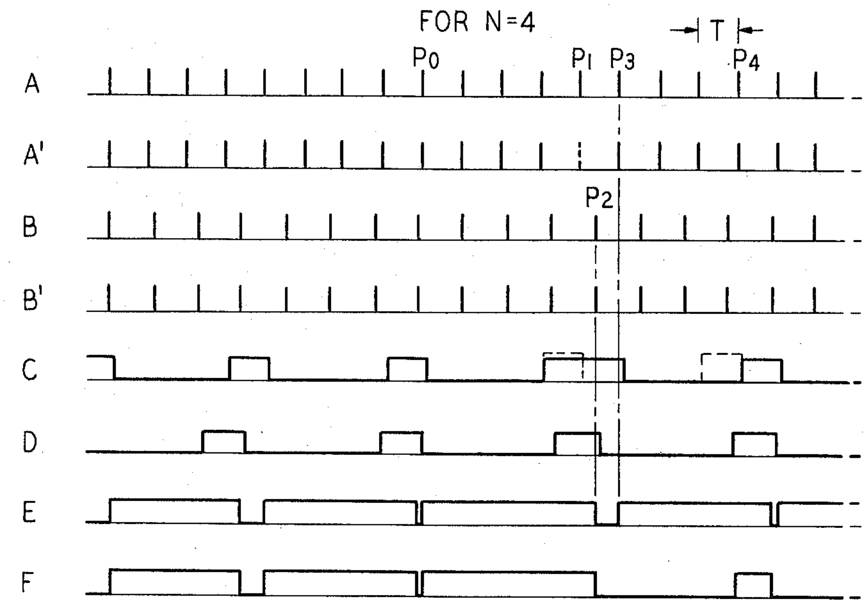
FIG. 2 is a timing diagram for the circuit of FIG. 1.

FIG. 1 is a schematic of a single flip-flop phase detector, modified to act as a phase and frequency comparator (PFC) according to the principles of the present invention. In FIG. 1 the input signal, $V_1$, represented by curve A in FIG. 2, is applied to the normal input of INHIBIT gate 10. The reference or VCO signal, $V_2$, represented by curve B in FIG. 2, is applied to the normal input of INHIBIT gate 11. Then the output of INHIBIT gate 10 is applied both to the input of counter circuit 12 and to the first input of two-input AND gate 14. In a similar manner, the output of INHIBIT gate 11 is applied to the input of counter circuit 13 and to the first input of two-input AND gate 15. These output signals from the INHIBIT gates are shown as curves A′ and B′ in FIG. 2. The counter circuits (12 and 13)

allow one of N pulses of the outputs of the INHIBIT gates to pass through them. For the purpose of this embodiment N is assumed to equal 4. The outputs of the counter circuits 12 and 13, represented by solid curves C and D in FIG. 2, are applied to the second inputs of two-input AND gates 14 and 15, respectively. In addition, the output of counter 12 is applied to the first input of two-input AND gate 16 and the output of counter 13 is applied to the first input of two-input AND gate 17. The output of AND gate 14 is applied to the SET input of flip-flop 18 and the output of AND gate 15 is applied to the RESET input. The Q output of flip-flop 18 which is the circuit output, $V_3$, is applied to the second input of AND gate 16 and the $\overline{Q}$ output is applied to the second input of AND gate 17. The Q output of the flip-flop is the output which has a digital "1" level when the SET input is triggered and the $\overline{Q}$ output is the one which has a digital "1" level when the RESET input is triggered. The outputs of AND gates 16 and 17 are applied to the inhibit inputs of INHIBIT gates 10 and 11, respectively.

With this arrangement the input and reference signals initially pass through INHIBIT gates 10 and 11 since the outputs of AND gates 16 and 17 will be logical "0's". After passing through the INHIBIT gates, these pulses are then blocked by AND gates 14 and 15 because of the "0" outputs from counter circuits 12 and 13. However, eventually the counter circuits will change states in response to the pulses applied to their inputs. This will then allow a pulse from the output of the INHIBIT gates to reach the flip-flop causing it to change states. In order to accomplish this according to the timing diagram in FIG. 2, the counter outputs must be delayed slightly relative to the pulses at A′. If such a delay does not occur naturally in the counter circuitry, it may be added at the counter input or output.

The phase difference between the two signals is represented by the pulse width of the signals at the Q or $\overline{Q}$ output of the flip-flop. In this case the output is taken from the Q output and it is shown by curve E in FIG. 2. If this circuit were included in a phase-locked loop, this signal would be passed through a low-pass filter to obtain a dc control signal and then biased about zero volts so that there would be a positive signal for a leading phase error and a negative signal for a lagging phase error. The effect of the counter circuits is to extend the linear range of the phase detector from ±180° to $N$ times ±180 degrees. This is shown in the transfer function of FIG. 3 where the linear range for $N = 4$ extends from $-4\pi$ to $+4\pi$.

If the INHIBIT gates and AND gates 16 and 17 were not part of the circuit, the Q output of the flip-flop would be like curve F in FIG. 2. Since the input frequency is higher than the reference frequency, the output of counter 12 would be at a higher frequency than the output of counter 13. Therefore, it would be possible for the flip-flop to receive two pulses from AND gate 14 before it receives one pulse from AND gate 15. In the timing diagram of FIG. 2, this hypothetical situation is initiated with pulse $P_0$ of curve A. The dotted curve C shows the output of counter 12 when the INHIBIT gates are not part of the circuit. The first dotted pulse allows the pulse $P_1$ to reach the SET input of the flip-flop before pulse $P_2$. Since the flip-flop was already set the pulse $P_1$ will have no effect. However, when pulse $P_2$ arrives at the flip-flop it will cause the flip-flop to reset and remain that way until pulse $P_4$ is allowed to pass by the second dotted pulse in curve C. As shown by curve F, this causes a drastic change in the average value of the output signal. Since this signal is later integrated and biased about zero, the resulting dc control signal will change from a relatively large positive value to a relatively large negative value. This change is indicated by the path 31 in FIG. 3. The result of this situation is that, even though there has been no change in the frequencies of the input and reference signal, the dc control signal changes polarity and produces an incorrect signal for the VCO. In general, the circuit will continue to slip along its characteristic curve in this manner, generating an alternating polarity signal which prevents the control loop from locking.

When the INHIBIT gates (10 and 11) and AND gates (16 and 17) are included in the circuit, the Q output is like that shown in curve E of FIG. 2. In this case, AND gate 16 monitors the output of counter 12 and the Q output of the flip-flop. When the pulse $P_1$ attempts to get through to the SET input of the flip-flop, AND gate 16 causes INHIBIT gate 10 to block it, since the counter and the Q outputs are both at logical "1's." This also prevents the pulse $P_1$ from reaching the counter circuit causing it to remain high for an additional period as shown by the solid curve C in FIG. 2. Then pulse $P_2$ passes to the RESET input and the flip-flop is reset. This causes AND gate 16 to remove the blocking signal from INHIBIT gate 10 and allows pulse $P_3$ to set the flip-flop at the next timing period.

Figure 3:
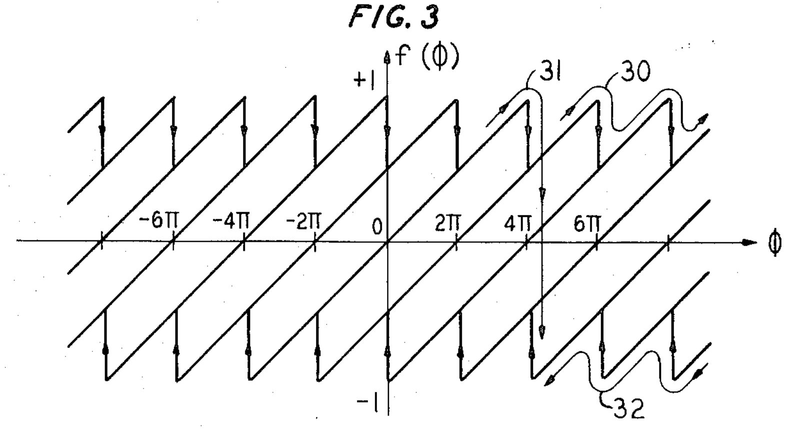
FIG. 3 is a transfer characteristic for the circuit of FIG. 1.

The result of this is that there is only a small change in the average value of the output signal when the linear portion of the transfer characteristic is exceeded. Although an alternating signal is produced, it is not great enough to change the polarity of the dc control signal for the VCO. This is represented by path 30 in FIG. 3. Since the signal remains positive, the VCO will continue to increase its frequency until it matches the input signal. Then the circuit will operate on one of the linear segments of the transfer curve, and phase matching will occur. It should be noted that if the input signal were lower in frequency than the reference signal, the circuit would function in the same manner except that INHIBIT gate 11 would be blocking additional RESET pulses and the circuit would operate along curve 32 in FIG. 3. In addition, it should be noted that the amount of ripple shown by FIG. 3 is directly proportional to the frequency division in the counter circuits. Therefore, by increasing the value of $N$, the amount of ripple in the dc control signal for the VCO can be reduced.

While the invention has been particularly shown and described with reference to preferred embodiments thereof, it will be understood by those skilled in the art that various changes in form and detail may be made therein without departing from the spirit and scope of the invention.

We claim:

1. A phase and frequency comparator which compares the phase and frequency of an input signal with that of a reference signal and produces an output signal related to the difference in phase and frequency, comprising:

means for inhibiting the input and reference signals in response to first and second inhibit signals;

means for separately counting the pulses of the input and reference signals which pass through said means for inhibiting and for producing output levels for every $N$th pulse;

switching means, responsive to the outputs of said means for inhibiting and said means for separately counting, for producing first and second complementary digital signals, the first complementary signal being the output of said comparator; and means for generating the first and second inhibit signals in response to the output of said means for separately counting, and said switching means.

2. A comparator as claimed in claim 1 wherein said means for inhibiting comprises:

a first INHIBIT gate with the input signal applied to the normal input and the first inhibit signal applied to the inhibit input; and a second INHIBIT gate with the reference signal applied to the normal input and the second inhibit signal applied to the inhibit input, the outputs of said first and second INHIBIT gates being said pulses which pass through said means for inhibiting.

3. A comparator as claimed in claim 2 wherein said means for separately counting comprises:

a first counter circuit for producing an output level for every $N$th pulse from said first INHIBIT gate; and a second counter circuit for producing an output level for every $N$th pulse from said second INHIBIT gate.

4. A comparator as claimed in claim 3 wherein said switching means comprises:

a first AND gate for combining the outputs of said first counter circuit and said first INHIBIT gate;

a second AND gate for combining the outputs of said second counter circuit and said second INHIBIT gate; and a reset-set flip-flop having complementary Q and $\overline{Q}$ outputs, the Q output being at a high digital level when the SET input is activated and the $\overline{Q}$ output being at a high digital level when the RESET input is activated, the output of said first AND gate being applied to the SET input of said flip-flop, the output of said second AND gate applied to the RESET input of said flip-flop, the output of the comparator and the first complementary signal being the signal at the Q output of said flip-flop and the second complementary signal being the signal at the $\overline{Q}$ output of said flip-flop.

5. A comparator as claimed in claim 4 wherein said means for generating the first and second inhibit signals comprises:

a third AND gate for combining the Q output of said flip-flop and the output of said first counter circuit, and a fourth AND gate for combining the $\overline{Q}$ output of said flip-flop and the output of said second counter circuit, the output of said third AND gate being the first inhibit signal and the output of said fourth AND gate being the second inhibit signal.

* * * * *